(12) United States Patent
Yamakawa

(10) Patent No.: US 10,910,939 B2
(45) Date of Patent: Feb. 2, 2021

(54) INVERTER DEVICE, GRADIENT AMPLIFIER, AND MAGNETIC RESONANCE IMAGING DEVICE

(71) Applicant: Canon Medical Systems Corporation, Otawara (JP)

(72) Inventor: Koichi Yamakawa, Nasushiobara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 107 days.

(21) Appl. No.: 15/929,045

(22) Filed: Sep. 20, 2018

(65) Prior Publication Data

US 2019/0097519 A1  Mar. 28, 2019

(30) Foreign Application Priority Data

Sep. 26, 2017 (JP) ................. 2017-185292

(51) Int. Cl.
| | |
|---|---|
| *H02M 1/088* | (2006.01) |
| *G01R 33/385* | (2006.01) |
| *H02M 7/537* | (2006.01) |
| *H02M 1/32* | (2007.01) |
| *H02M 1/00* | (2006.01) |
| *H02M 7/5387* | (2007.01) |

(52) U.S. Cl.
CPC ........ *H02M 1/088* (2013.01); *G01R 33/3852* (2013.01); *H02M 1/32* (2013.01); *H02M 7/537* (2013.01); *H02M 7/53871* (2013.01); *H02M 2001/0009* (2013.01); *H02M 2001/327* (2013.01)

(58) Field of Classification Search
None
See application file for complete search history.

(56) References Cited

U.S. PATENT DOCUMENTS

| 10,302,719 B2 * | 5/2019 | Lin ................... G01R 33/3852 |
| 2013/0015802 A1 * | 1/2013 | Hirose ................. B60L 15/007 |
| | | 318/488 |

FOREIGN PATENT DOCUMENTS

| JP | 05-068331 | 3/1993 |
| JP | 2005-143232 | 6/2005 |
| JP | 2014023312 A | * 2/2014 |

* cited by examiner

*Primary Examiner* — Paresh Patel
(74) *Attorney, Agent, or Firm* — Oblon, McClelland, Maier & Neustadt, L.L.P.

(57) ABSTRACT

An inverter device according to an embodiment includes a plurality of switching elements and processing circuitry. The switching elements are connected to each other in parallel, and each of them includes a transistor and a free wheeling diode connected to the transistor in antiparallel. The processing circuitry is configured to monitor a current flowing through the free wheeling diode included in each switching element or a temperature of the free wheeling diode and to control, in accordance with the current or the temperature, a load on each free wheeling diode to prevent unbalance of loads between free wheeling diodes in the switching elements.

10 Claims, 10 Drawing Sheets

INVERTER DEVICE, GRADIENT AMPLIFIER, AND MAGNETIC RESONANCE IMAGING DEVICE

CROSS-REFERENCE TO RELATED APPLICATIONS

This application is based upon and claims the benefit of priority from Japanese Patent Application No. 2017-185292, filed on Sep. 26, 2017; the entire contents of which are incorporated herein by reference.

FIELD

Embodiments described herein relate generally to an inverter device, a gradient amplifier, and a magnetic resonance imaging device.

BACKGROUND

Conventionally, high-output inverter devices typically have such an implementation form that switching elements are connected in parallel to ensure a current capacity. In this kind of inverter device, when the device is in operation highly loaded, the amount of heat generated by the switching elements is large, and accordingly variations in element characteristics between the switching elements are increased, which may result in unbalance of loads. Although a rated range is maintained while loads are balanced, there is a possibility that, when loads are unbalanced between the switching elements, a heavily loaded switching element gets damaged due to thermal runaway, and as a result, the inverter device improperly operates.

DETAILED DESCRIPTION

An inverter device according to an embodiment includes a plurality of switching elements and processing circuitry. The switching elements are connected to each other in parallel, and each of them includes a transistor and a free wheeling diode connected to the transistor in antiparallel. The processing circuitry is configured to monitor a current flowing through the free wheeling diode included in each switching element or a temperature of the free wheeling diode and to control, in accordance with the current or the temperature, a load on each free wheeling diode to prevent unbalance of loads between free wheeling diodes in the switching elements.

With reference to drawings, a detailed explanation is given below of an inverter device, a gradient amplifier, and a magnetic resonance imaging (MRI) device according to the embodiment.

First Embodiment

Figure 1:
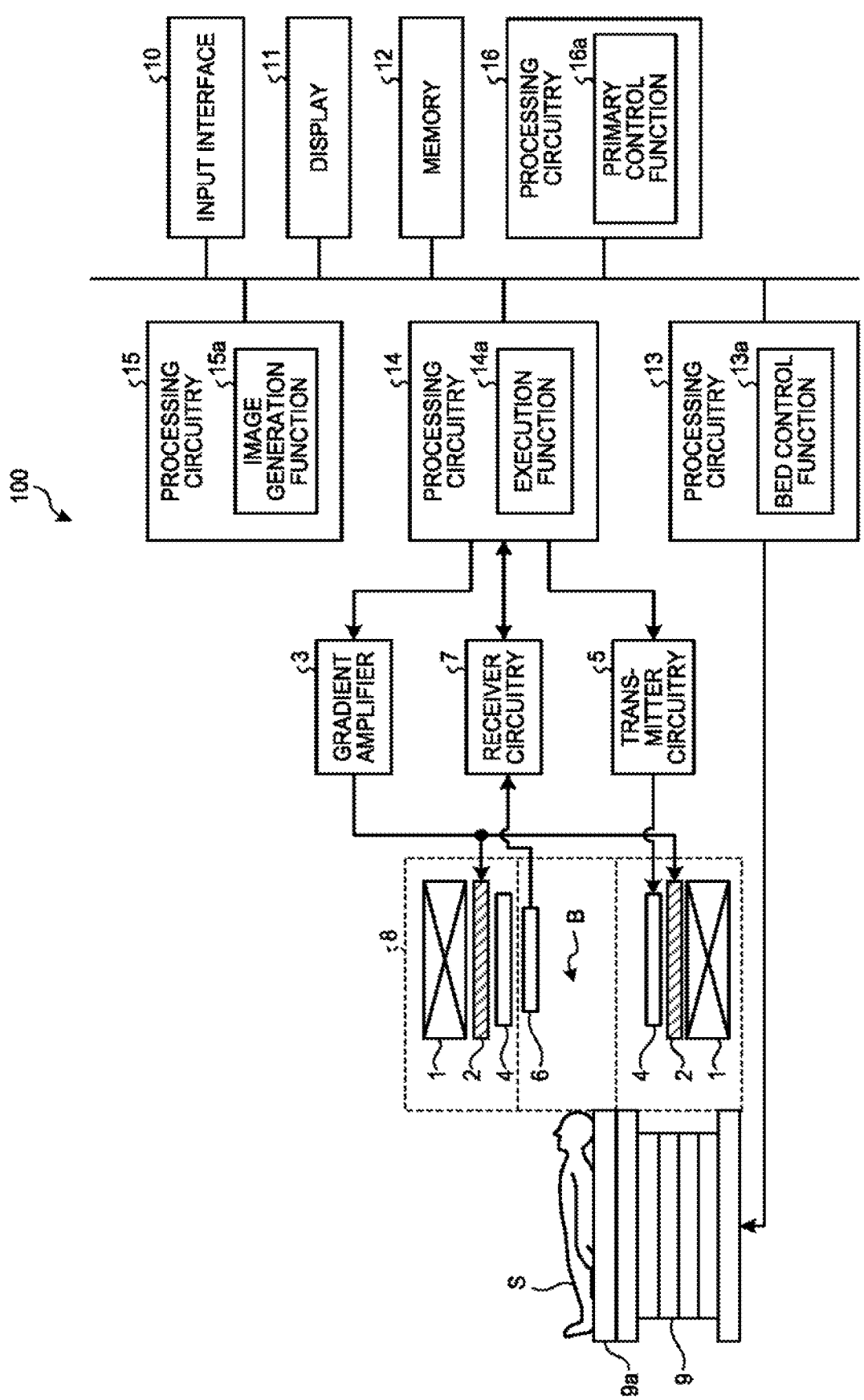
FIG. 1 is a diagram that illustrates an example of the configuration of a magnetic resonance imaging device according to a first embodiment.

FIG. 1 is a diagram that illustrates an example of the configuration of an MRI device 100 according to a first embodiment. For example, as illustrated in FIG. 1, the MRI device 100 according to the present embodiment includes a static magnetic field magnet 1, a gradient coil 2, a gradient amplifier 3, a transmitter coil 4, transmitter circuitry 5, a receiver coil 6, receiver circuitry 7, a gantry 8, a couch 9, an input interface 10, a display 11, a memory 12, and processing circuitries 13 to 16.

The static magnetic field magnet 1 generates a static magnetic field in the imaging space where a subject S is located. Specifically, the static magnetic field magnet 1 is formed into substantially a cylindrical shape (including the one that has an elliptical shape in cross-section perpendicular to the central axis of the cylinder) with a hollow, and it generates a static magnetic field in the space within the cylinder. For example, the static magnetic field magnet 1 includes a cooling container that is formed in substantially a cylindrical shape and a magnet such as superconductive magnet that is immersed into coolant (e.g., liquid helium) with which the cooling container is filled. Here, for example, the static magnetic field magnet 1 may generate a static magnetic field by using a permanent magnet.

The gradient coil 2 is located inside the static magnetic field magnet 1, and it applies a gradient magnetic field to the imaging space where the subject S is located. Specifically, the gradient coil 2 is formed into substantially a cylindrical shape (including the one that has an elliptical shape in cross-section perpendicular to the central axis of the cylinder) with a hollow, and it generates a gradient magnetic field in the space inside the cylinder along axes, the X axis, the Y axis, and the Z axis that run at right angles to one another. Here, the X axis, the Y axis, and the Z axis constitute the device coordinate system that is unique to the MRI device 100. For example, the Z axis corresponds to the axis of the cylinder of the gradient coil 2, and it is set along the magnetic flux of the static magnetic field generated by the static magnetic field magnet 1. Furthermore, the X axis is set in a horizontal direction perpendicular to the Z axis, and the Y axis is set in a vertical direction perpendicular to the Z axis.

The gradient amplifier 3 supplies the current to the gradient coil 2, thereby generating a gradient magnetic field in the space inside the gradient coil 2 along each of the X axis, the Y axis, and the Z axis.

As the gradient amplifier 3 generates a gradient magnetic field along each of the X axis, the Y axis, and the Z axis as described above, gradient magnetic fields may be generated along a read-out direction, a phase encode direction, and a slice direction. The axes along the read-out direction, the phase encode direction, and the slice direction constitute a logical coordinate system that defines a slice area or a volume area, which is the target to be imaged. Furthermore, hereinafter, the gradient magnetic field along the read-out direction is referred to as a read-out gradient magnetic field, a gradient magnetic field along the phase encode direction is referred to as a phase-encode gradient magnetic field, and the gradient magnetic field along the slice direction is referred to as a slice gradient magnetic field.

The gradient magnetic fields are overlapped with the static magnetic field that is generated by the static magnetic field magnet 1, and it is used to apply spatial positional information to MR (magnetic resonance) signals. Specifically, the read-out gradient magnetic field changes the frequency of MR signals in accordance with a position in the read-out direction so as to apply the positional information along the read-out direction to the MR signal. Furthermore, the phase-encode gradient magnetic field changes the phase of MR signals along the phase encode direction so as to apply the positional information in the phase encode direction to the MR signal. Furthermore, the slice gradient magnetic field is used to determine the direction of a slice area, the thickness, or the number of pieces when the imaging area is a slice area and, when the imaging area is a volume area, it changes the phase of MR signals in accordance with a position in the slice direction so as to apply the positional information along the slice direction to the MR signal.

The transmitter coil 4 is an RF (radio frequency) coil that is located inside the gradient coil 2 and that applies an RF magnetic field to the imaging space where the subject S is located. Specifically, the transmitter coil 4 is formed into substantially a cylindrical shape (including the one that has an elliptical shape in cross-section perpendicular to the central axis of the cylinder) with a hollow, and in accordance with RF pulse signals output from the transmitter circuitry 5, applies an RF magnetic field to the space inside the cylinder.

The transmitter circuitry 5 outputs RF pulse signals, which correspond to the Larmor frequency, to the transmitter coil 4.

The receiver coil 6 is an RF coil that receives MR signals generated from the subject S. For example, the receiver coil 6 is attached to the subject S who is located inside the transmitter coil 4, and it receives MR signals generated from the subject S as being affected by the RF magnetic field applied by the transmitter coil 4. Then, the receiver coil 6 outputs received MR signals to the receiver circuitry 7. For example, as the receiver coil 6, a dedicated coil is used for each target site to be captured. Here, a dedicated coil is, for example, a receiver coil for head, a receiver coil for neck, a receiver coil for shoulders, a receiver coil for chest, a receiver coil for abdomen, a receiver coil for lower extremity, a receiver coil for spine, and the like.

The receiver circuitry 7 generates MR signal data on the basis of an MR signal, output from the receiver coil 6, and outputs the generated MR signal data to the processing circuitry 14.

Furthermore, in the example explained here, the transmitter coil 4 applies an RF magnetic field and the receiver coil 6 receives MR signals; however, this is not a limitation on the configuration of each RF coil. For example, the transmitter coil 4 may further have a receiving function to receive MR signals, or the receiver coil 6 may further have a transmitting function to apply an RF magnetic field. When the transmitter coil 4 has a receiving function, the receiver circuitry 7 generates MR signal data from MR signals received by the transmitter coil 4. Furthermore, when the receiver coil 6 has a transmitting function, the transmitter circuitry 5 also outputs RF pulse signals to the receiver coil 6.

The gantry 8 houses tree static magnetic field magnet 1, the gradient coil 2, and the transmitter coil 4. Specifically, the gantry 8 has a hollow bore B that is formed in a cylindrical shape, and it houses the static magnetic field magnet 1, the gradient coil 2, and the transmitter coil 4 such that they are arranged to surround the bore B. Here, the space inside the bore B provided by the gantry 8 is the imaging space where the subject S is located when imaging is conducted on the subject S.

Furthermore, in the example explained according to the present embodiment, the MRI device 100 includes the static magnetic field magnet 1 and the gradient coil 2 that are formed in substantially a cylindrical shape, i.e., it is configured to have a tunnel-like shape; however, this is not a limitation on the embodiment. For example, the MRI device 100 may have a configuration such that a pair of static magnetic field magnets and a pair of gradient coils are arranged as being opposed to each other with the imaging space, where the subject S is located, interposed therebetween, i.e., an opened shape.

The couch 9 includes a couchtop 9a, on which the subject S is placed and, when imaging is conducted on the subject S, it inserts the couchtop 9a into the inner side of the bore B of the gantry 8. For example, the couch 9 is arranged such that its longitudinal direction is parallel to the central axis of the static magnetic field magnet 1.

The input interface 10 receives input operation of various commands and various types of information from to the processing circuitry 16 so that it converts input operation, received from an operator, into an electric signal and outputs it to a control circuit. For example, the input interface 10 is implemented by using a trackball, switch button, mouse, or keyboard for setting capturing conditions, the region of interest (ROI), and the like, a touch-pad for conducting input operation by touching an operation surface, a touch screen on which a display screen and a touch-pad are integrated, a non-contact input interface that uses an optical sensor, a sound input interface, or the like. Furthermore, in this specification, the input interface 10 is not limited to the one that includes a physical operating component such as mouse or keyboard. Examples of the input interface 10 include processing circuitry for electric signals, which receives electric signals that correspond to input operation from an external input device, which is provided separately from a device, and outputs the electric signals to a control circuit.

The display 11 presents various types of information and various images. Specifically, the display 11 is connected to the processing circuitry 16 so that it converts data on various types of information and various images, transmitted from the processing circuitry 16, into electric signals for display and outputs them. For example, the display 11 is implemented by using a liquid crystal monitor, a CRT (cathode ray tube) monitor, a touch panel, or the like.

The memory 12 stores various types of data. Specifically, the memory 12 stores MR signal data or image data. For example, the memory 12 is implemented by using a semiconductor memory device, such as a RAM (random access memory) or a flash memory, a hard disk, an optical disk, or the like.

The processing circuitry 13 has a bed control function 13a. The bed control function 13a is connected to the couch 9 so that it outputs electric signals for control to the couch 9, thereby controlling operation of the couch 9. For example, the bed control function 13a receives a command to move the couchtop 9a in the longitudinal direction, the vertical direction, or the horizontal direction from an operator via the input interface 10, and it operates a driving mechanism for the couchtop 9a, included in the couch 9, to move the couchtop 9a in accordance with the received command.

The processing circuitry 14 has an execution function 14a. The execution function 14a conducts various pulse sequences by driving the gradient amplifier 3, the transmitter circuitry 5, and the receiver circuitry 7 on the basis of sequence execution data output from the processing circuitry 16. For example, the execution function 14a transmits input signals to each of the gradient amplifier 3, the transmitter circuitry 5, and the receiver circuitry 7 to drive the gradient amplifier 3, the transmitter circuitry 5, and the receiver circuitry 7.

Here, the sequence execution data is information that defines the pulse sequence that indicates the procedure for collecting MR signal data. Specifically, the sequence execution data is information that defines the timing in which the gradient amplifier 3 supplies current to the gradient coil 2 and the level of the supplied current, the level of the RF pulse signal supplied to the transmitter coil 4 by the transmitter circuitry 5 and the supply timing, the detection timing in which the receiver circuitry 7 detects MR signals, and the like.

Furthermore, as a result of execution of various pulse sequences, the execution function 14a receives MR signal data from the receiver circuitry 7 and stores the received MR signal data in the memory 12. Furthermore, the set of MR signal data, received by the execution function 14a, is arranged in two dimensions or three dimensions in accordance with positional information, which is given by the read-out gradient magnetic field, the phase-encode gradient magnetic field, and the slice gradient magnetic field, described above, so that it is stored as data that forms the k space in the memory 12.

The processing circuitry 15 has an image generation function 15a. The image generation function 15a generates images on the basis of MR signal data that is stored in the memory 12. Specifically, the image generation function 15a reads MR signal data that is stored in the memory 12 by using the execution function 14a and performs post-processing, i.e., reconstruction process such as Fourier transform, on the read MR signal data to generate images. Furthermore, the image generation function 15a stores the image data on the generated image in the memory 12.

The processing circuitry 16 has a primary control function 16a. The primary control function 16a controls each component included in the MRI device 100, thereby performing the overall control on the MRI device 100. For example, the primary control function 16a receives input of a capturing condition from an operator via the input interface 10. Then, the primary control function 16a generates sequence execution data based on the received capturing condition and transmits the sequence execution data to the processing circuitry 14, thereby conducting various pulse sequences. Furthermore, for example, the primary control function 16a reads image data from the memory 12 in accordance with a request from an operator and outputs it to the display 11.

Here, for example, each of the above-described processing circuitries 13 to 16 is implemented by using a processor. In such a case, for example, each processing function provided in the processing circuitries 13 to 16 is stored in the memory 12 in the form of program executable by a computer. Each processing circuitry reads each program from the memory 12 and executes it to implement the function that corresponds to each program. In other words, in a state where each program has been read, each processing circuitry has each function that is illustrated in each processing circuitry of FIG. 1.

With this configuration, in the MRI device 100 according to the present embodiment, in accordance with an input signal transmitted from the processing circuitry 14, the gradient amplifier 3 outputs, to the gradient coil 2, the voltage that corresponds to the waveform of the gradient magnetic field applied to the imaging space. Here, the input signal is a signal that indicates the waveform of the gradient magnetic field generated in the gradient coil 2, and it is a signal that simulates with currents the waveform of the gradient magnetic field applied when a pulse sequence is executed.

Figure 2:
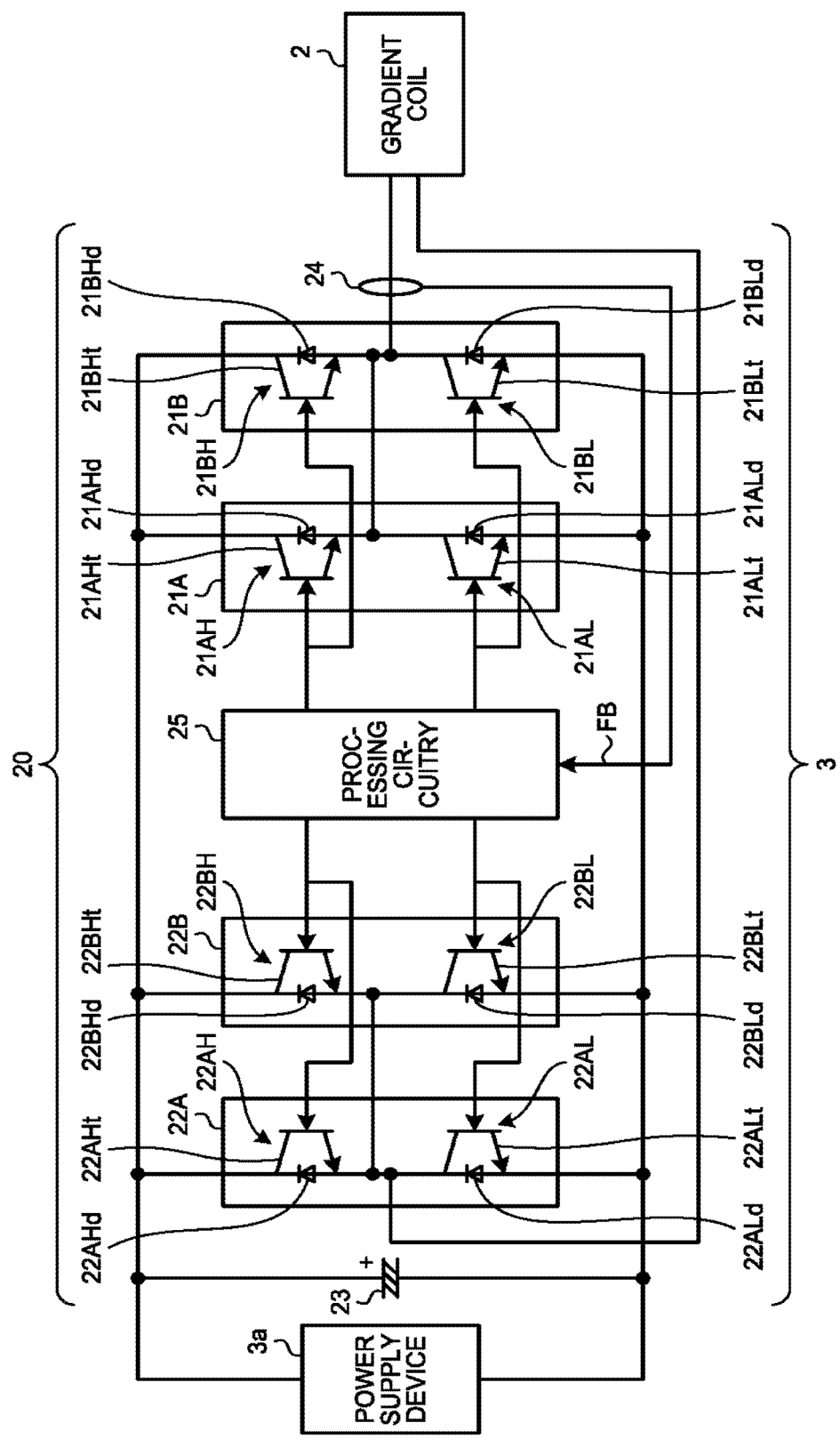
FIG. 2 is a diagram that illustrates an example of the configuration of a gradient amplifier according to the first embodiment.

FIG. 2 is a diagram that illustrates an example of the configuration of the gradient amplifier 3 according to the first embodiment. For example, as illustrated in FIG. 2, the gradient amplifier 3 includes a power supply device 3a and an inverter device 20.

The power supply device 3a feeds direct-current power to the inverter device 20 on the basis of power supplied from undepicted power equipment.

The inverter device 20 outputs, to the gradient coil 2, the pulse voltage that corresponds to the waveform of the gradient magnetic field applied to the imaging space on the basis of the direct-current power supplied from the power supply device 3a.

For example, as illustrated in FIG. 2, the inverter device 20 include a first switching module 21A, a second switching module 21B, a third switching module 22A, a fourth switching module 22B, an electrolytic capacitor 23, a current sensor 24, and processing circuitry 25.

Here, the first switching module 21A and the second switching module 21B or the third switching module 22A and the fourth switching module 22B are connected to each other in parallel with respect to the power supply device 3a.

The first switching module 21A includes a pair of switching elements 21AH and 21AL that are connected in series. Specifically, the switching element 21AH on the upper side (positive side) includes a transistor 21AHt and a free wheeling diode 21AHd that is connected in antiparallel between the collector and the emitter of the transistor 21AHt. Furthermore, the switching element 21AL on the lower side (negative side) includes a transistor 21ALt and a free wheeling diode 21ALd that is connected in antiparallel between the collector and the emitter of the transistor 21ALt.

Similarly, the second switching module 21B includes a pair of switching elements 21BH and 21BL that are connected in series. Specifically, the switching element 21BH on the upper side includes a transistor 21BHt and a free wheeling diode 21BHd that is connected in antiparallel between the collector and the emitter of the transistor 21BHt. Furthermore, the switching element 21BL on the lower side includes a transistor 21BLt and a free wheeling diode 21BLd that is connected in antiparallel between the collector and the emitter of the transistor 21BLt.

Similarly, the third switching module 22A includes a pair of switching elements 22AH and 22AL that are connected in series. Specifically, the switching element 22AH on the upper side includes a transistor 22AHt and a free wheeling diode 22AHd that is connected in antiparallel between the collector and the emitter of the transistor 22AHt. Furthermore, the switching element 22AL on the lower side includes a transistor 22ALt and a free wheeling diode 22ALd that is connected in antiparallel between the collector and the emitter of the transistor 22ALt.

Similarly, the fourth switching module 22B includes a pair of switching elements 22BH and 22BL that are connected in series. Specifically, the switching element 22BH on the upper side includes a transistor 22BHt and a free wheeling diode 22BHd that is connected in antiparallel between the collector and the emitter of the transistor 22BHt. Furthermore, the switching element 22BL on the lower side includes a transistor 22BLt and a free wheeling diode 22BLd that is connected in antiparallel between the collector and the emitter of the transistor 22BLt.

For example, the first switching module 21A, the second switching module 21B, the third switching module 22A, and the fourth switching module 22B are IGBT (insulated gate bipolar transistor) modules. That is, a transistor included in each switching module is IGBT, and a free wheeling diode is FWD (free wheeling diode).

Here, the first switching module 21A, the second switching module 21B, the third switching module 22A, and the fourth switching module 22B, described above, constitute a full-bridge circuit, and they output the pulse voltage to the gradient coil 2 in accordance with the direct-current power supplied from the power supply device 3a.

Specifically, the switching elements 21AH and 21BH on the upper side, included in the first switching module 21A and the second switching module 21B, respectively, constitute the upper arm of one of the legs in the full-bridge circuit. Furthermore, the switching elements 21AL and 21BL on the lower side, included in the first switching module IA and the second switching module 21B, respectively, constitute the lower arm of one of the legs in the full-bridge circuit. Furthermore, the switching elements 22AH and 22BH on the upper side, included in the third switching module 22A and the fourth switching module 22E, respectively, constitute the upper arm of the other one of the legs in the full-bridge circuit. Moreover, the switching elements 22AL and 22BL on the lower side, included in the third switching module 22A and the fourth switching module 22B, respectively, constitute the lower arm of the other one of the legs in the full-bridge circuit.

Here, in the first switching module 21A and the second switching module 21B, the route between the switching element 21AH on the upper side and the switching element 21AL on the lower side in the first switching module 21A is connected to the route between the switching element 21BH on the upper side and the switching element 21BL on the lower side in the second switching module 21B. Thus, in the first switching module 21A and the second switching module 21B, each of the pair of the switching elements 21AH and 21BH on the upper side and the pair of the switching elements 21AL and 21BL on the lower side is independently connected in parallel.

Similarly, in the third switching module 22A and the fourth switching module 22B, the route between the switching element 22AH on the upper side and the switching element 22AL on the lower side in the third switching module 22A is connected to the route between the switching element 22BH on the upper side and the switching element 22BL on the lower side in the fourth switching module 22B. Thus, in the third switching module 22A and the fourth switching module 22B, each of the pair of the switching elements 22AH and 22BH on the upper side and the pair of the switching elements 22AL and 22BL on the lower side is independently connected in parallel.

Furthermore, one of the positive terminal and the negative terminal provided in the gradient coil 2 is connected to the route between the switching elements 21AH and 21BH on the upper side and the switching elements 21AL and 21BL on the lower side in the first switching module 21A and the second switching module 21B. Moreover, the other one of the positive terminal and the negative terminal provided in the gradient coil 2 is connected to the route between the switching elements 22AH and 22BH on the upper side and the switching elements 22AL and 22BL on the lower side in the third switching module 22A and the fourth switching module 22B.

With this configuration, when the pair of the switching elements 21AH and 21BH on the upper side in the first switching module 21A and the second switching module 21B and the pair of the switching elements 22AL and 22BL on the lower side in the third switching module 22A and the fourth switching module 223 are electrically connected, currents flow through the gradient coil 2 in a forward direction. Conversely, when the pair of the switching elements 21AL and 21BL on the lower side in the first switching module 21A and the second switching module 212 and the pair of the switching elements 22AH and 22BH on the upper side in the third switching module 22A and the fourth switching module 22B are electrically connected, currents flow through the gradient coil 2 in an opposite direction. Then, by alternately itching the two states, a pulse voltage with any pulse width may be continuously output.

The electrolytic capacitor 23 is located between the power supply device 3a and the first switching module 21A, the second switching module 21B, the third switching module 22A, and the fourth switching module 22B, and it smooths the current supplied from the power supply device 3a to each switching module.

The current sensor 24 is provided at the output terminal of the gradient amplifier 3, and it detects the current flowing through the gradient coil 2. Furthermore, the current sensor 24 transmits a feedback signal FB indicating the level of detected current to the processing circuitry 25.

The processing circuitry 25 drives each switching module in accordance with an input signal transmitted from the processing circuitry 14, thereby outputting, to the gradient coil 2, the pulse voltage that corresponds to the waveform of the gradient magnetic field applied to the imaging space.

Specifically, the processing circuitry 25 receives an input signal transmitted from the processing circuitry 14 and the feedback signal FB transmitted from the current sensor 24 and generates an error signal that is the difference between the input signal and the feedback signal FB that are received. Then, the processing circuitry 25 conducts PWM (pulse width modulation) on the generated error signal and drives each switching module on the basis of the PWM signal, thereby generating the pulse voltage that corresponds to the level of the error signal.

Here, the processing circuitry 25 feeds a control al to each switching element to alternately switch the state where the pair of the switching elements 21AH and 21BH on the upper side in the first switching module 21A and the second switching module 21B and the pair of the switching elements 22AL and 22BL on the lower side in the third switching module 22A and the fourth switching module 22B are electrically connected and a state where the pair of the switching elements 21AL and 21BL on the lower side in the first switching module 21A and the second switching module 21B and the pair of the switching elements 22AH and 22BH on the upper side in the third switching module 22A and the fourth switching module 22B are electrically connected, thereby generating the pulse voltage that corresponds to the level of the error signal.

That is, in accordance with the feedback signal FB transmitted from the current sensor 24, the processing circuitry 25 controls the pulse voltage output from each switching element to the gradient coil 2 so that the current flowing through the gradient coil 2 is identical to the input signal transmitted from the processing circuitry 14.

Here, in inverter devices that are implemented by connecting a plurality of switching elements in parallel, like the inverter device 20 according to the present embodiment, when the device is in operation highly loaded, a switching element generates a large amount of heat, and accordingly unbalance of loads between the switching elements sometimes occurs. Although a rated range is maintained while loads are balanced, there is a possibility that, when loads are unbalanced between the switching elements, a heavily loaded switching element gets damaged due to thermal runaway, and as a result, the inverter device improperly operates.

Thus, the inverter device 20 according to the present embodiment has the configuration described below so as to operate in a stable manner even in a highly-loaded operating state.

Typically, it is known that, among semiconductor elements that are made of semiconductor such as silicon, there are elements with temperature dependence of output characteristics being positive and elements being negative. Furthermore, it is considered that noticeable unbalance of loads between switching elements described above especially occurs in elements with temperature dependence of output characteristics being negative.

Figure 3:
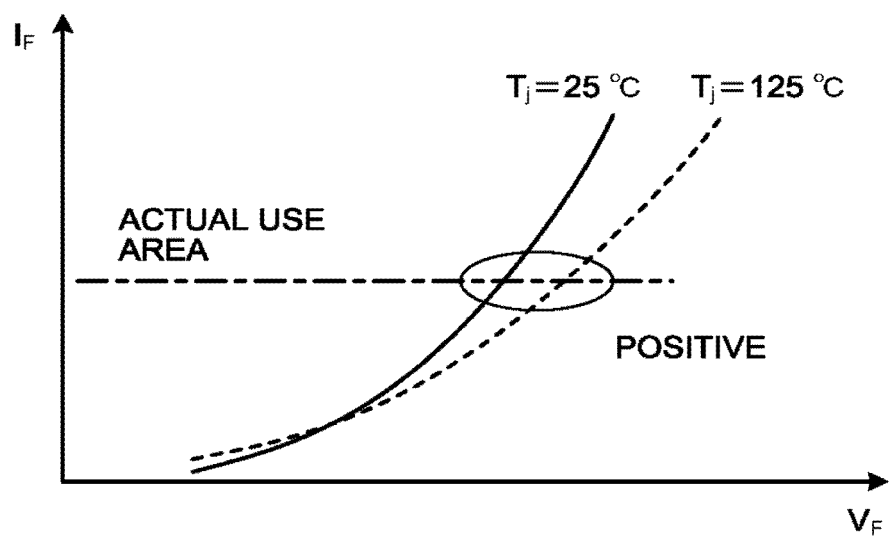
FIG. 3 is a graph that illustrates an example of output characteristics of a semiconductor element related to an inverter device according to the first embodiment.
Figure 4:
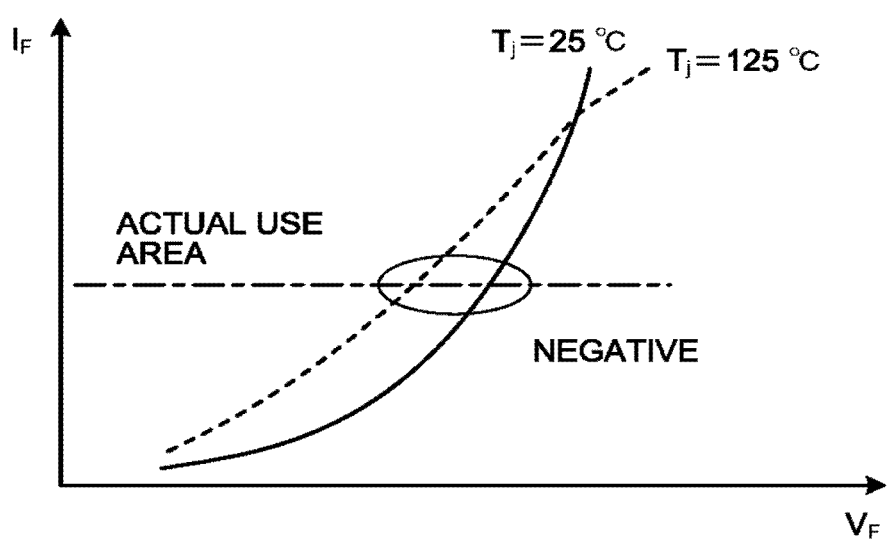
FIG. 4 is a graph that illustrates an example of output characteristics of a semiconductor element related to the inverter device according to the first embodiment.

FIGS. 3 and 4 are graphs that illustrate an example of output characteristics of a semiconductor element related to the inverter device 20 according to the first embodiment. Here, FIG. 3 illustrates an example of the output characteristics of an element with temperature dependence of output characteristics being positive at the actual use area assumed, and FIG. 4 illustrates an example of the output characteristics of an element with temperature dependence of output characteristics being negative at the actual use area assumed. Furthermore, each of FIGS. 3 and 4 illustrates output characteristics at junction temperature $T_j=25°$ C. and output characteristics at $T_j=125°$ C.

For example, as illustrated in FIG. 3, when the temperature dependence of output characteristics of the element is at a positive area, the characteristics are such that, as the temperature increases, the current is less likely to flow. Therefore, it is considered that, when elements whose temperature dependence of output characteristics is at a positive area are connected in parallel, the difference in the current flowing through each element is reduced in accordance with an increase in heat generated by each element and thus unbalance of loads between elements is naturally prevented.

Conversely, for example, as illustrated in FIG. 4, the temperature dependence of output characteristics of the element is at a negative area, the characteristics are such that, as the temperature increases, the current is likely to flow. Therefore, it is considered that, when elements whose temperature dependence of output characteristics is at a negative area are connected in parallel, the difference in the current flowing through each element is increased in accordance with an increase in heat generated by each element and thus unbalance of loads between elements tends to increase.

Here, it is generally known that transistors tend to have a wider area where the temperature dependence of output characteristics is positive and diodes tend to have a wider area where the temperature dependence of output characteristics is negative. Therefore, when switching elements including a transistor and a free wheeling diode are connected in parallel, like the inverter device 20 according to the present embodiment, it is considered that unbalance of loads occurs more easily in free wheeling diodes than in transistors.

For example, in an inverter device, when switching elements are connected in parallel, the switching elements with the same collector-emitter saturation voltage $V_{ce}$ (sat) are typically used so that the element characteristics of the switching elements are matched. As described above, however, it is considered that when a switching element includes a transistor and a free wheeling diode, unbalance of loads easily occurs in the free wheeling diode than the transistor. Therefore, for example, in the case of use application with a high reflux ratio to the free wheeling diode, it is considered that unbalance of loads between free wheeling diodes in switching elements is not sufficiently controlled by simply matching $V_{ce}$ (sat) that is the characteristic of transistors.

Figure 5:
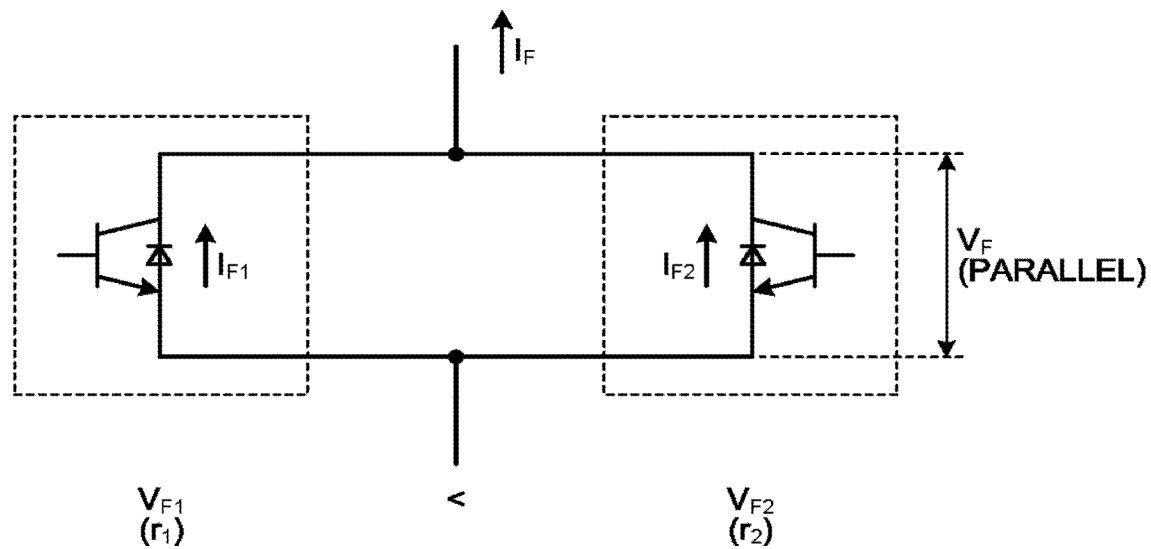
FIG. 5 is a diagram that illustrates an example of the relation between the characteristic of a free wheeling diode and unbalance of loads regarding the inverter device according to the first embodiment.
Figure 6:
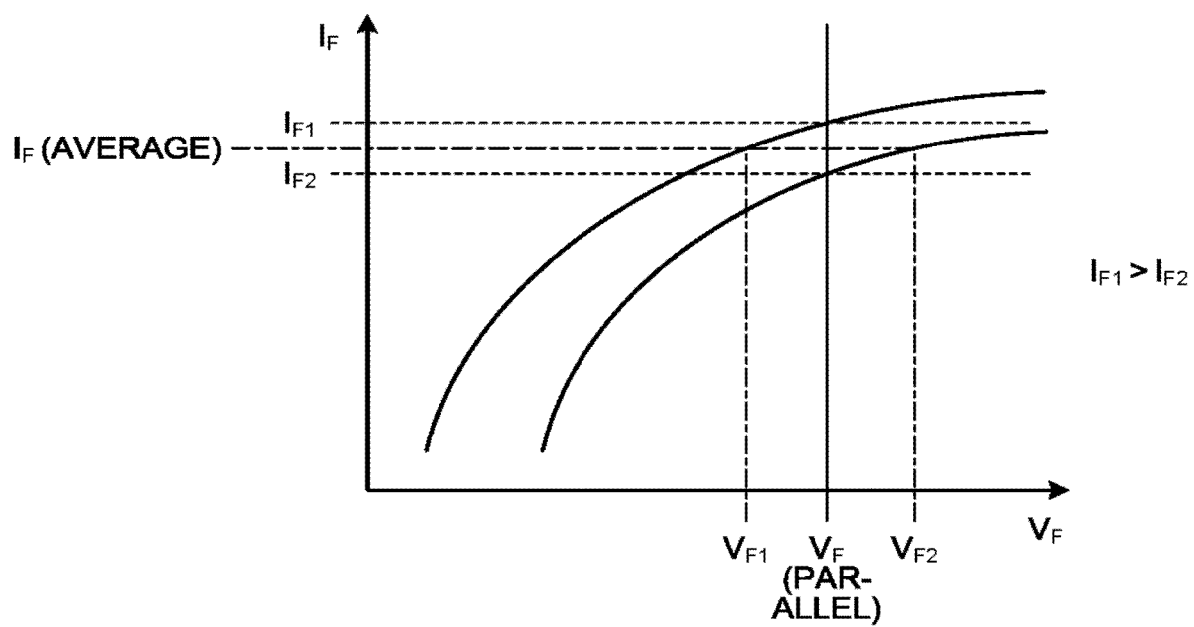
FIG. 6 is a diagram that illustrates an example of the relation between the characteristic of a free wheeling diode and unbalance of loads regarding the inverter device according to the first embodiment.

FIGS. 5 and 6 are diagrams that illustrate an example of the relation between the characteristic of a free wheeling diode and unbalance of loads regarding the inverter device 20 according to the first embodiment. Here, FIG. 5 illustrates an example of a parallel circuit in which a pair of switching elements including a transistor and a free wheeling diode is connected in parallel. Furthermore, FIG. 6 illustrates an example of the $I_F$-$V_F$ characteristic of the free wheeling diode included in each of the switching elements illustrated in FIG. 5.

A consideration is given to parallel connection of pairs of switching elements including a transistor and a free wheeling diode, as illustrated in for example FIG. 5. Here, in the two switching elements illustrated in FIG. 5, the free wheeling diode included in the switching element illustrated on one side (the left side in FIG. 5) has a resistance and the free wheeling diode included in the switching element illustrated on the other side (the right side in FIG. 5) has a resistance $r_2$ that is higher than $r_1$.

In this case, for example, as illustrated in FIG. 6, even when the same current If (average) flows, the voltages of the free wheeling diodes included in the respective switching elements are different, $V_{F1}$ and $V_{F2}$. Here, in FIG. 6, the curved line on the upper side represents the characteristic of the free wheeling diode included in one switching element, and the curved line on the lower side represents the characteristic of the free wheeling diode included in the other switching element.

Here, for example, when the free wheeling diodes with the different voltages $V_{F1}$ and $V_{F2}$ are connected in parallel, the current with a level $I_{F1}$ flows through the free wheeling diode included in one switching element, and current $I_{F2}$ that is smaller than $I_{F1}$ flows through the free wheeling diode included in the other switching element. Specifically, the relation between $I_{F1}$ and $I_{F2}$ is represented by using the following Equations (1) to (3).

$$I_{F1} \cong \frac{r_2 \times (I_{F1} + I_{F2})}{(r_1 + r_2)} \quad (1)$$

$$I_{F2} \cong \frac{r_1 \times (I_{F1} + I_{F2})}{(r_1 + r_2)} \quad (2)$$

$$\frac{I_{F1}}{I_{F2}} = \frac{r_2}{r_1} \quad (r_2 > r_1) \quad (3)$$

As described above, when switching elements including free wheeling diodes with different characteristics are connected in parallel, currents with different levels flow through the respective free wheeling diodes, and as a result, there occurs unbalance between the free wheeling diodes.

For this reason, the inverter device 20 according to the present embodiment is configured such that unbalance of loads between free wheeling diodes in switching elements is prevented.

Specifically, according to the present embodiment, the parallely connected switching elements are configured by combining free wheeling diodes having the same characteristics. For example, according to the present embodiment, parallelly connected switching elements are configured by combining the same switching elements with $V_F$ of a free wheeling diode in addition to $V_{ce}$ (sat) of a transistor.

For example, in the first switching module 21A and the second switching module 21B, each of the pair of the switching elements 21AH and 21BH on the upper side and the pair of the switching elements 21AL and 21BL on the lower side is configured by combining the switching elements having the free wheeling diodes with the same characteristics. Furthermore, in the third switching module 22A and the fourth switching module 22B, each of the pair of the switching elements 22AH and 22BH on the upper side and the pair of the switching elements 22AL and 22BL on the lower side is configured by combining the switching elements having the free wheeling diodes with the same characteristics.

Thus, it is possible to reduce the risk of occurrence of unbalance of loads even in free wheeling diodes where unbalance of loads easily occurs in a noticeable manner as the temperature dependence of output characteristics in the actual use area that is assumed is negative. As a result, a reduction in the risk of thermal runaway is possible for free wheeling diodes.

Furthermore, as described above, free wheeling diodes tend to have a wider area where the temperature dependence of output characteristics is negative; therefore, when the device is in operation highly loaded, variations in characteristics are increased due to heat generated, and unbalance of loads may occur.

Figure 7:
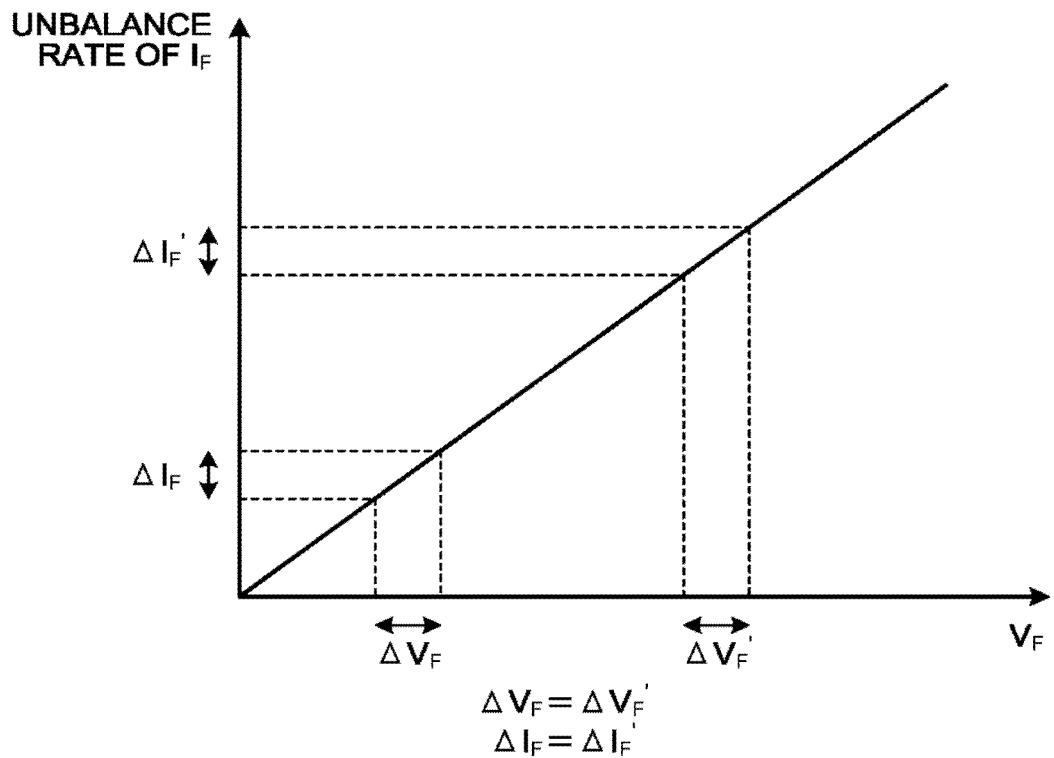
FIG. 7 is a graph that illustrates an example of the relation between characteristics of a parallely connected free wheeling diode and the unbalance rate of load with regard to the inverter device according to the first embodiment.
Figure 8:
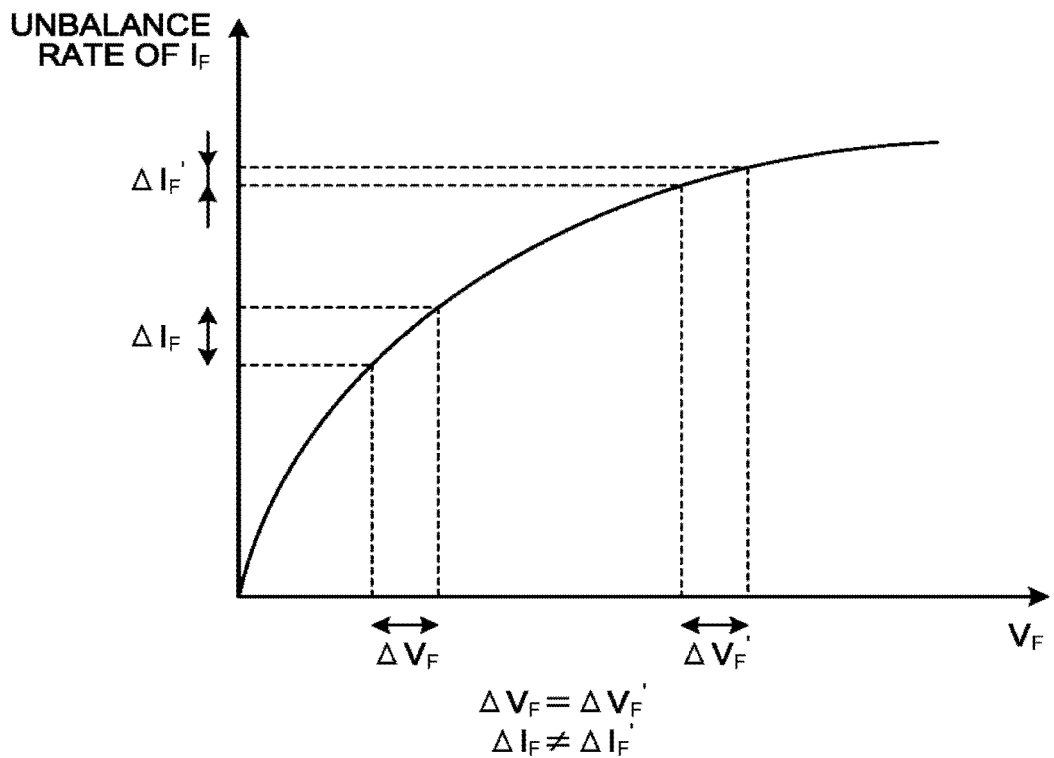
FIG. 8 is a graph that illustrates an example of the relation between characteristics of a parallely connected free wheeling diode and the unbalance rate of load with regard to the inverter device according to the first embodiment.

FIGS. 7 and 8 are graphs that illustrate an example of the relation between characteristics of a parallely connected free wheeling diode and the unbalance rate of load with regard to the inverter device 20 according to the first embodiment. Here, FIGS. 7 and 8 illustrate an example of the relation between a difference $\Delta V_F$ in the voltage $V_F$ of a free wheeling diode and the unbalance rate of the current $I_F$ that occurs in the free wheeling diode.

For example, as illustrated in FIG. 7, if the unbalance rate of the current $I_F$ occurring in the free wheeling diode changes as a linear function relative to the value of the voltage $V_F$ of the parallely connected free wheeling diode and the difference $\Delta V_F$ in the voltage, the unbalance rate of the current $I_F$ occurring in the free wheeling diode is constant as long as the difference $\Delta V_F$ in the voltage $V_F$ of the free wheeling diode is constant.

However, it is generally considered that the unbalance rate of the current $I_F$ occurring in a free wheeling diode changes as a log function relative to the value of the voltage $V_F$ of the free wheeling diode and the difference $\Delta V_F$ in the voltage, as illustrated in for example FIG. 8. Therefore, even though the difference $\Delta V_F$ in the voltage $V_F$ in the free wheeling diode is constant, the unbalance rate of the current $I_F$ occurring in the free wheeling diode is not constant. For example, specifically, although the difference $\Delta V_F$ in the voltage $V_F$ of the free wheeling diode is the same, the unbalance rate of the current $I_F$ occurring in the free wheeling diode tends to be high when the voltage $V_F$ of the free wheeling diode is low, and the unbalance rate of the current $I_F$ occurring in the free wheeling diode tends to be low when the voltage $V_F$ of the free wheeling diode is high.

Furthermore, as the output characteristics of free wheeling diodes change due to a temperature, it is considered that unbalance of loads occurring in free wheeling diodes largely change depending on a use situation after operation of the device is started.

For this reason, furthermore, the inverter device 20 according to the present embodiment is configured such that unbalance of loads between free wheeling diodes in switching elements is autonomously controlled after operation of the device is started.

Figure 9:
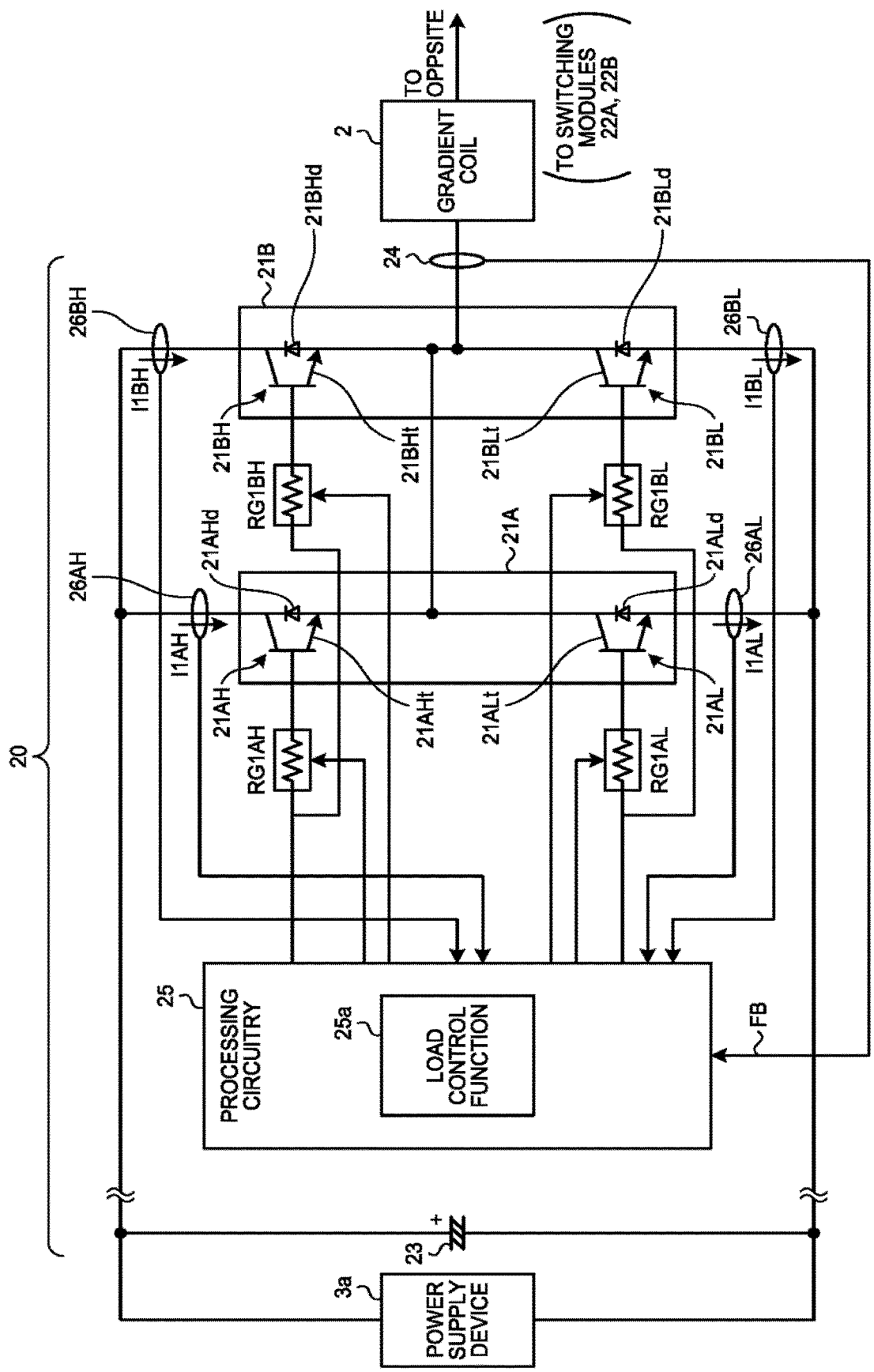
FIG. 9 is a diagram that illustrates an example of the configuration of the inverter device according to the first embodiment.

FIG. 9 is a diagram that illustrates an example of the configuration of the inverter device 20 according to the first embodiment. Here, in FIG. 9, for the convenience of explanation, illustrations are omitted for the configurations related to the third switching module 22A and the fourth switching module 22B, included in the configuration illustrated in FIG. 2.

For example, as illustrated in FIG. 9, the processing circuitry 25 of the inverter device 20 according to the present embodiment includes a load control function 25a. Here, the load control function 25a according to the present embodiment is an example of a load control unit. Here, the load control unit may be implemented by using hardware such as a circuit and software in a mixed manner.

The load control function 25a monitors the current flowing through a free wheeling diode included in each switching element and, in accordance with the current, controls the load on each free wheeling diode to prevent unbalance of loads between free wheeling diodes in switching elements. According to the present embodiment, the load control function 25a manages the characteristics of the free wheeling diode included in each switching element to prevent unbalanced losses of the free wheeling diodes.

Specifically, the load control function 25a detects a current I1AH flowing through the free wheeling diode 21AHd included in the first switching module 21A via a first current sensor 26AH provided at the input terminal of the first switching module 21A. Furthermore, the load control function 25a detects a current I1BH flowing through the free wheeling diode 21BHd included in the second switching module 21B via a second current sensor 26BH provided at the input terminal of the second switching module 21B. Here, for example, the first current sensor 26AH and the second current sensor 26BH are implemented by using a Hall element, a shunt resistance, or the like.

Figure 10:
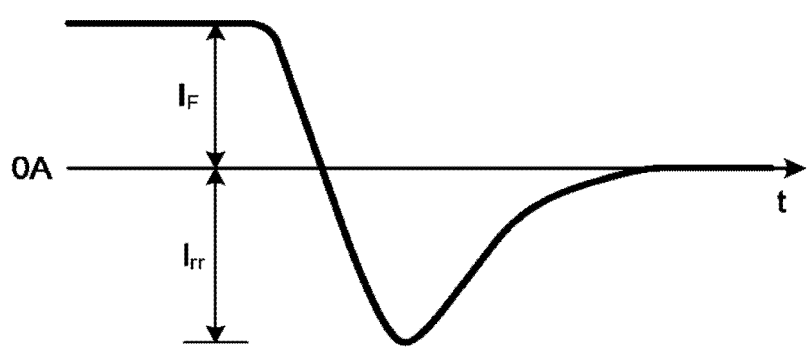
FIG. 10 is a timing chart that illustrates electrical characteristics of a free wheeling diode with regard to the inverter device according to the first embodiment.

FIG. 10 is a timing chart that illustrates electrical characteristics of a free wheeling diode with regard to the inverter device 20 according to the first embodiment.

For example, as illustrated in FIG. 10, when the transistor of a switching element turned on and the current $I_F$ flowing through the free wheeling diode is blocked, a peak in a negative direction called a reverse recovery current $I_{rr}$ occurs. Furthermore, typically, it is considered that, when unbalance of loads occurs between switching elements, the current values $I_{rr}$ and $I_F$ become unbalanced.

Therefore, according to the present embodiment, the load control function 25a monitors the reverse recovery current $I_{rr}$ of a free wheeling diode as the current flowing through the free wheeling diode. Here, the load control function 25a may monitor the forward current $I_F$ instead of $I_{rr}$. Here, with regard to the current monitored by the load control function 25a, not only $I_{rr}$ and $I_F$ of free wheeling diodes but also currents in any timing when unbalance of loads between switching elements noticeably appears may be selected as appropriate from a timing chart in accordance with an operation condition of the inverter device 20, characteristics of a switching element used, or the like.

Furthermore, the load control function 25a controls load on each free wheeling diode to prevent unbalance of loads between switching elements on the basis of the current detected via the first current sensor 26AH and the second current sensor 26BH.

Specifically, the load control function 25a controls loss in the free wheeling diode included in each switching element, thereby controlling the load on each switching element.

Here, it is generally difficult to directly operate free wheeling diodes from outside. Furthermore, it is known that, in switching elements that combine a transistor and a free wheeling diode, loss allocation between a transistor and a free wheeling diode also changes in accordance with dV/dt (the amount of change in a voltage per unit time) during a switching operation of the transistor. For example, it is known that, as dV/dt decreases, turn-on switching loss Eon of a transistor increases while the reverse recovery loss $E_{rr}$ of a free wheeling diode tends to decrease. Furthermore, it is known that, when switching elements are connected in parallel, loss allocation between free wheeling diodes also changes depending on whether a switching operation is quick or slow. For instance, it is known that losses are likely to be concentrated in a free wheeling diode of a transistor that is turned on quickly.

Therefore, according to the present embodiment, the load control function 25a controls dV/dt (the amount of change in the voltage per unit time) during a switching operation of the transistor included in each switching element, thereby indirectly controlling losses of the free wheeling diode.

Specifically, the load control function 25a controls dV/dt by controlling the gate resistance of the transistor included in each switching element. Here, the load control function 25a changes the resistance value of the gate resistance of the transistor included in each switching element to control dV/dt. By increasing the resistance value of the gate resistance, dV/dt may be decreased, and accordingly $E_{rr}$ of the free wheeling diode may be reduced.

Here, typically, in switching output circuits using a switching element, the dead time (quiescent time) is provided in the transition period between the on state and the off state; however, when dV/dt decreases, a switching time increases, and therefore it may be sometimes difficult to ensure a sufficient dead time. For this reason, it is preferable to set a limit on the adjustable range of the resistance value of the gate resistance so as to fulfill a predetermined dead time.

Furthermore, there is a trade-off between a decrease in $E_{rr}$ of the free wheeling diode due to a reduction in dV/dt and an increase in Eon of the transistor; however, it is considered that, when the temperature dependence of output characteristics of a transistor at the actual use area is positive, the risk of thermal runaway due to unbalance of loads is lower as compared with a free wheeling diode having a wider area where the temperature dependence of output characteristics is negative.

Figure 11:
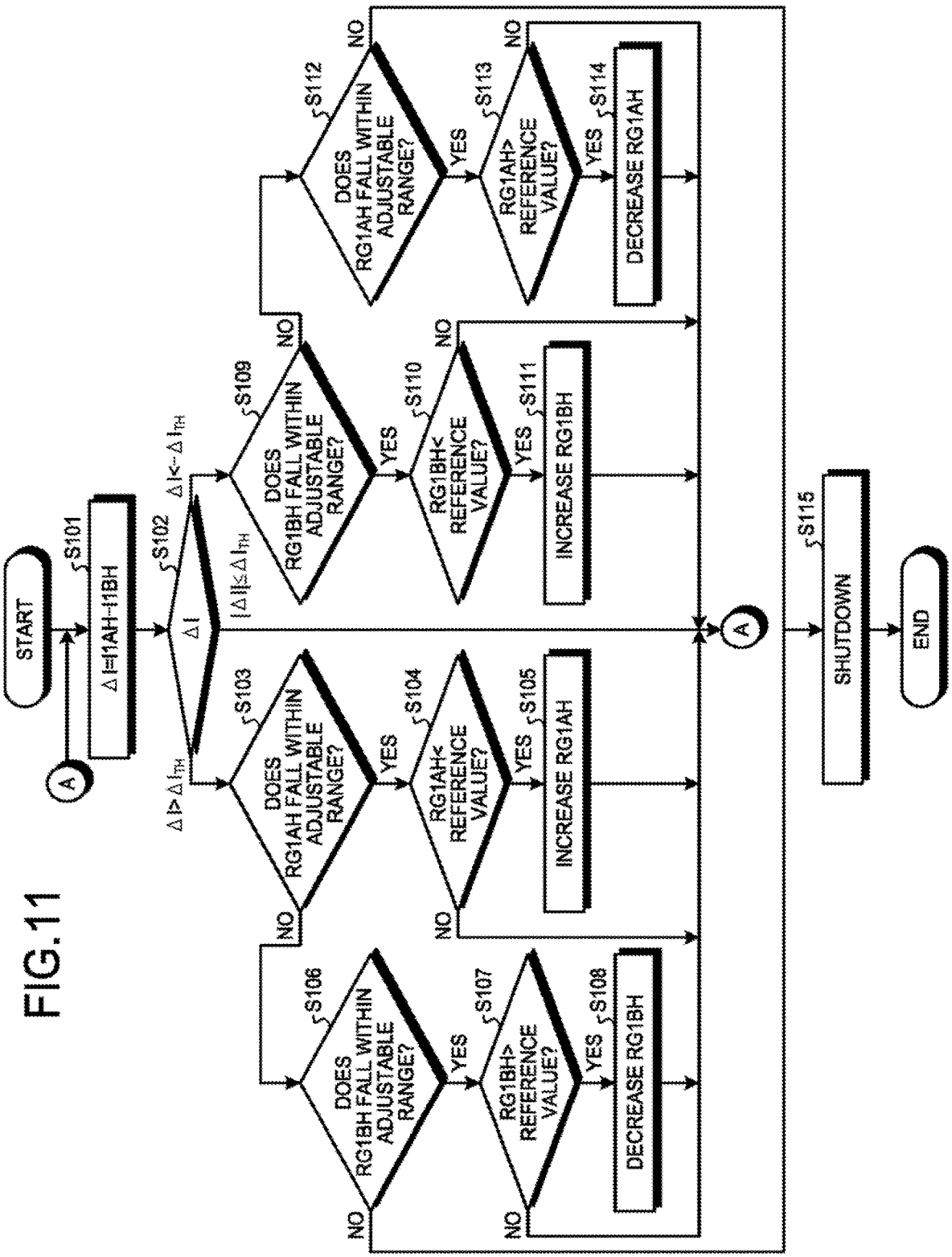
FIG. 11 is a flowchart that illustrates the steps of a process performed by a load control function according to the first embodiment.

FIG. 11 is a flowchart that illustrates the steps of a process performed by the load control function 25a according to the first embodiment. For example, as illustrated in FIG. 11, the load control function 25a calculates the difference ΔI between the current I1AH detected via the first current sensor 26AH and the current I1BH detected via the second current sensor 26BH (Step S101).

Here, when the absolute value of ΔI is equal to or less than a predetermined threshold $\Delta I_{TH}$ (Step S102, down), the load control function 25a determines that unbalance of loads between the free wheeling diodes in the switching elements falls within an acceptable range and returns to Step S161 to calculate ΔI again. Conversely, when the absolute value of ΔI is more than $VI_{TH}$, the load control function 25a determines that there is unbalance of loads between the free wheeling diodes in the switching elements and performs the following process.

First, when ΔI is more than $\Delta I_{TH}$ (Step S102, left), the load control function 25a determines that the load on the free wheeling diode 21AHd included in the first switching module 21A is high and then determines whether the resistance value of a gate resistance RG1AH of the transistor 21AHt included in the first switching module 21A falls within a predetermined adjustable range (Step S103). Here, for example, the predetermined adjustable range is defined by using predetermined maximum value $RG_{max}$ and minimum value $RG_{min}$.

Then, when RG1AH falls within the predetermined adjustable range (Step 103, Yes), the load control function 25a determines whether RG1AH is less than the reference value (Step 104). Here, when RG1AH is less than the reference value (Step S104, Yes), the load control function 25a increases RG1AH by a predetermined value to reach the reference value (Step S105).

Thus, the reverse recovery loss $E_{rr}$ of the free wheeling diode 21AHd included in the first switching module 21A decreases, and accordingly the load on the free wheeling diode 21AHd is reduced. As a result, there is a reduction in unbalance of loads between the free wheeling diode 21AHd included in the first switching module 21A and the free wheeling diode 21BHd included in the second switching module 21B.

Conversely, when RG1AH does not fall within the predetermined adjustable range (Step S103, No), the load control function 25a determines that adjustment of RG1AH is not allowed and then determines whether the resistance value of a gate resistance RG1BH of the transistor 21BHt included in the second switching module 21B falls within a predetermined adjustable range (Step S106). Here, for example, the predetermined adjustable range is defined by using the predetermined maximum value $RG_{max}$ and minimum value $RG_{min}$.

Then, when RG1BH falls within the predetermined adjustable range (Step S106, Yes), the load control function 25a determines whether RG1BH is more than the reference value (Step S107). Here, when RG1BH is more than the reference value (Step S107, Yes), the load control function 25a decreases RG1BH by a predetermined value to reach the reference value (Step S108).

This allows the level of load on e free wheeling diode 21BHd included in the second switching module 21B to reach the level of load on the free wheeling diode 21AHd included in the first switching module 21A. As a result, there is a reduction in unbalance of loads between the free wheeling diode 21AHd included in the first switching module 21A and the free wheeling diode 21BHd included in the second switching module 21B.

Conversely, when ΔI is less than −ΔI$_{TH}$ (Step S102, right), the load control function 25a determines that the load on the free wheeling diode 21BHd included in the second switching module 21B is high and then determines whether the resistance value of the date resistance RG1BH of the transistor 21BHt included in the second switching module 21B falls within a predetermined adjustable range (Step S109). Here, for example, the predetermined adjustable range is defined by using the predetermined maximum value RG$_{max}$ and minimum value RG$_{min}$.

Then, when RG1BH falls within the predetermined adjustable range (Step S109, Yes), the load control function 25a determines whether RG1BH is less than the reference value (Step S110). Here, when RG1BH is less than the reference value (Step S110, Yes), the load control function 25a increases RG1BH by a predetermined value to reach the reference value (Step S111).

Thus, the reverse recovery loss E$_{rr}$ of the free wheeling diode 21BHd included in the second switching module 21B is decreased, and accordingly the load on the free wheeling diode 21BHd is reduced. As a result, there is a reduction in unbalance of loads between the free wheeling diode 21BHd included in the second switching module 21B and the free wheeling diode 21AHd included in the first switching module 21A.

Conversely, when RG1BH does not fall within the predetermined adjustable range (Step S109, No), the load control function 25a determines that adjustment of RG1BH is not allowed and then determines whether the resistance value of the gate resistance RG1AH of the transistor 21AHt included in the first switching module 21A falls within the predetermined adjustable range (Step S112). Here, for example, the predetermined adjustable range is defined by using the predetermined maximum value RG$_{max}$ and minimum value RG$_{min}$.

Then, when RG1AH falls within the predetermined adjustable range (Step S112, Yes), the load control function 25a determines whether RG1AH is more than the reference value (Step S113). Here, when RG1AH is more than the reference value (Step S113, Yes), the load control function 25a decreases RG1AH by a predetermined value to reach the reference value (Step S114).

This allows the level of load on the free wheeling diode 21AHd included in the first switching module 21A to reach the level of load on the free wheeling diode 21BHd included in the second switching module 21B. As a result, there is a reduction in unbalance of loads between the free wheeling diode 21BHd included in the second switching module 21B and the free wheeling diode 21AHd included in the first switching module 21A.

After RG1AH or RG1BH is adjusted as described above, the load control function 25a returns to Step S101 to calculate ΔI again and then repeatedly performs the above-described process.

Conversely, when neither RG1AH nor RG1BH fall within the adjustable range (Step S106, No, Step S112, No), the load control function 25a does not adjust the resistance value of a gate resistance but shuts down the direct-current power supplied to each switching module (Step S115).

Furthermore, the load control function 25a controls switching elements 21AL and 21BL on the lower side in the first switching module 21A and the second switching module 21B in the same manner as well as the switching elements 21AH and 21BH on the upper side. Specifically, the load control function 25a detects a current I1AL flowing through the free wheeling diode 21ALd on the lower side, included in the first switching module 21A, via a third current sensor 26AL provided at the output terminal of the first switching module 21A. Then, in accordance with the detected current I1AL, the load control function 25a adjusts the resistance value of a gate resistance RG1AL of the transistor 21ALt on the lower side, included in the first switching module 21A. Furthermore, the load control function 25a detects a current I1BL flowing through the free wheeling diode 21BLd on the lower side, included in the second switching module 21B, via a fourth current sensor 26BL provided at the output terminal of the second switching module 21B. Then, in accordance with the detected current I1BL, the load control function 25a adjusts the resistance value a gate resistance RG1BL of the transistor 21BLt on the lower side, included in the second switching module 21B. Furthermore, the load control function 25a controls the switching elements 22AH and 22BH on the upper side and the switching elements 22AL and 22BL on the lower side in the third switching module 22A and the fourth switching module 22B in the same manner.

Here, for example, the above-described processing circuitry 25 is implemented by using a processor. In this case, for example, the load control function 25a included in the processing circuitry 25 is stored in a predetermined memory in the form of program executable by a computer. The processing circuitry 25 reads a program from the memory and executes it, thereby performing the function that corresponds to the program. In other words, after having read the program, the processing circuitry 25 includes the load control function 25a illustrated in the processing circuitry 25 of FIG. 9. In this case, for example, each of the operations at Steps S101 to S115 illustrated in FIG. 11 is performed when, for example, the processing circuitry 25 reads the program that corresponds to the load control function 25a from the predetermined memory and executes it.

Here, in the example illustrated in FIG. 9, the load control function 25a is implemented by using the single processing circuitry 25; however, this is not a limitation on embodiments. For example, the processing circuitry 25 may be configured by combining multiple independent processors so that the load control function 25a is implemented when each of the processors executes a program. Furthermore, the load control function 25a included in the processing circuitry 25 may be implemented by being distributed or combined in one or more processing circuits as appropriate.

As described above, according to the first embodiment, the load control function 25a included in the processing circuitry 25 of the inverter device 20 monitors the current flowing through the free wheeling diode included in each switching element and, in accordance with the current, controls the load on each free wheeling diode to prevent unbalance of loads between the free wheeling diodes in the switching elements.

That is, according to the first embodiment, when unbalance of loads occurs between free wheeling diodes in switching elements, the unbalance is autonomously controlled due to the load control function 25 included in the processing circuitry 25 so that the inverter device 20 may be kept in a stable direction. As a result, it is possible to prevent damages to free wheeling diodes due to thermal runaway.

Thus, the inverter device 20, the gradient amplifier 3, and the magnetic resonance imaging device 100 according to the first embodiment can operate in a stable manner even in a state of highly loaded operation.

Second Embodiment

Here, in the example explained according to the above first embodiment, the load control function 25a monitors the current flowing through the free wheeling diode included in each switching element and controls the load on each free wheeling diode; however, this is not a limitation on embodiments.

For example, it is typically considered that heat generated by free wheeling diodes is a direct cause of damages to free wheeling diodes due to unbalance of loads. Therefore, the load control function 25a may monitor the temperature of the free wheeling diode included in each switching element to control the load on each free wheeling diode. The example of such a case is explained below as a second embodiment. Here, in the second embodiment, part that is different from the first embodiment is primarily explained, and detailed explanation is omitted for the contents that are common to the first embodiment or other embodiments.

Figure 12:
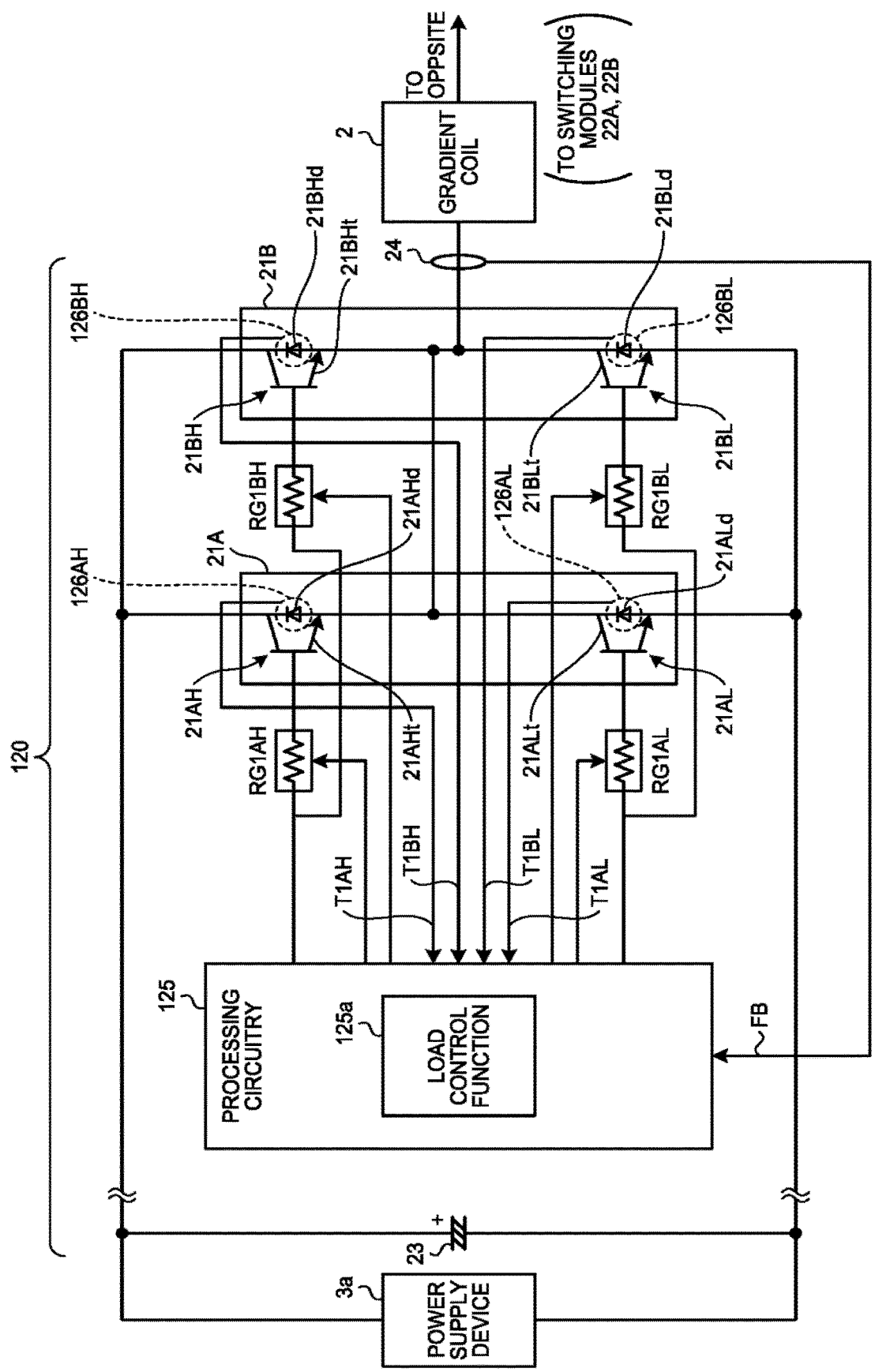
FIG. 12 is a diagram that illustrates an example of the configuration of an inverter device according to a second embodiment.

FIG. 12 is a diagram that illustrates an example of the configuration of an inverter device 120 according to the second embodiment. Here, in FIG. 12, for the convenience of explanation, illustrations for the configurations related to the third switching module 22A and the fourth switching module 22B are omitted, included in the configurations illustrated in FIG. 2.

For example, as illustrated in FIG. 12, according to the present embodiment, processing circuitry 125 of the inverter device 120 includes a load control function 125a. Here, the load control function 125a according to the present embodiment is an example of a load control unit. Here, the load control unit may be implemented by mixing hardware such as a circuit and software.

The load control function 125a monitors the temperature of the free wheeling diode included in each switching element and, in accordance with the temperature, controls the load on each free wheeling diode to prevent unbalance of loads between the free wheeling diodes in the switching elements. According to the present embodiment, the load control function 125a manages characteristics of the free wheeling diode included in each switching element, thereby preventing unbalanced losses of the free wheeling diodes.

Specifically, the load control function 125a detects a temperature T1AH of the free wheeling diode 21AHd included in the first switching module 21A via a first temperature sensor 126AH provided in the first switching module 21A. Furthermore, the load control function 25a detects a temperature T1BH of the free wheeling diode 21BHd included in the second switching module 21B via a second temperature sensor 126BH provided in the second switching module 21B.

Here, for example, the load control function 125a monitors the junction temperature $T_j$ as the temperature of a free wheeling diode. Here, for example, when it is difficult to directly detect $T_j$ of a switching element, the load control function 125a may monitor a case temperature $T_c$ of a switching element and calculate $T_j$ from $T_c$.

Then, the load control function 125a controls the load on each free wheeling diode in accordance with the temperatures detected via the first temperature sensor 126AH and the second temperature sensor 126BH to prevent unbalance of loads between the switching elements.

That is, as is the case with the first embodiment, the load control function 125a controls losses of the free wheeling diode included in each switching element, thereby controlling the load on each switching element. Specifically, in the same manner as in the first embodiment, the load control function 125a controls dV/dt (the amount of change in a voltage per unit time) during a switching operation of the transistor included in each switching element, thereby indirectly controlling losses of free wheeling diodes. More specifically, in the same manner as in the first embodiment, the load control function 125a controls a gate resistance of the transistor included in each switching element, thereby controlling dV/dt.

Figure 13:
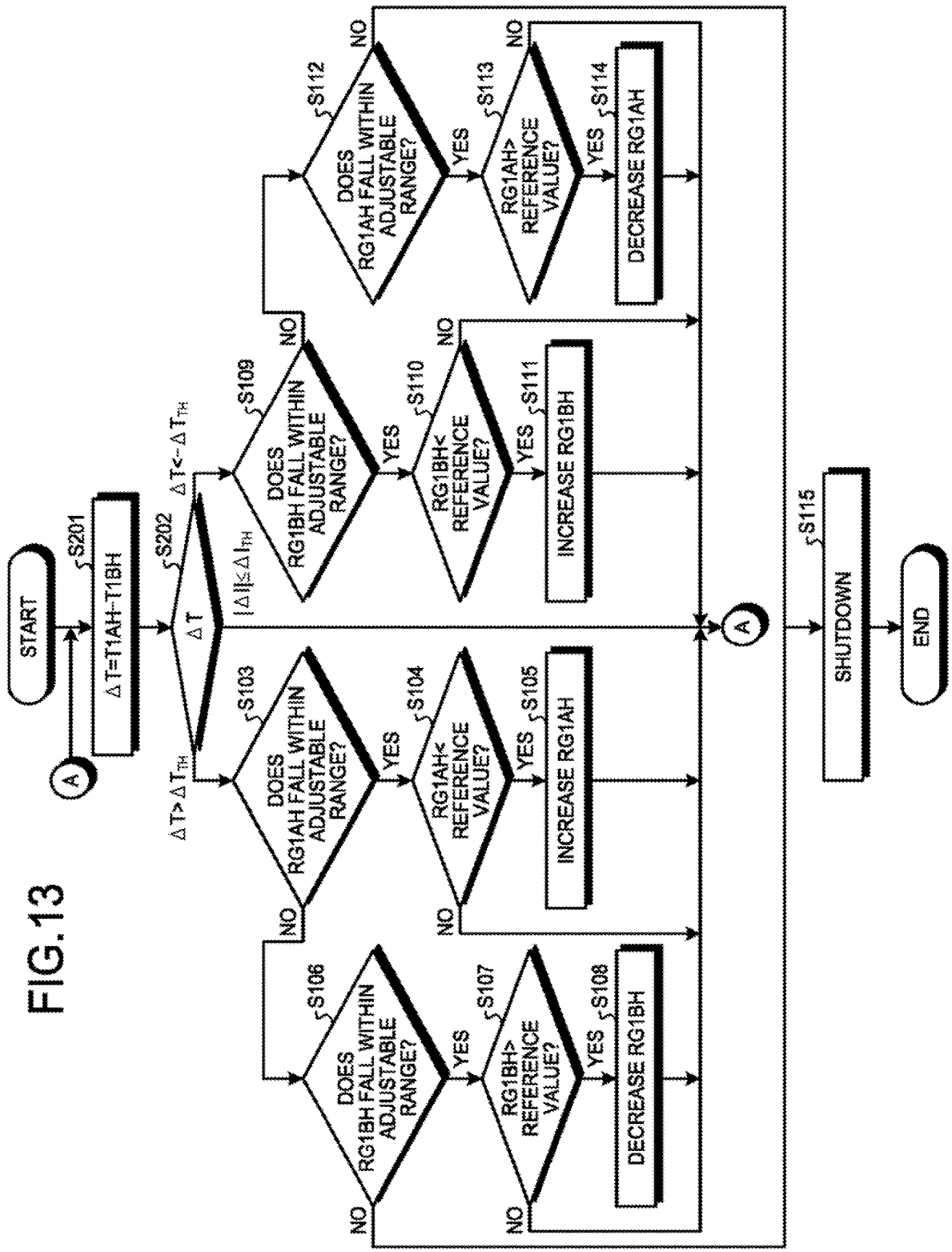
FIG. 13 is a flowchart that illustrates the steps of the process performed by a load control function according to the second embodiment.

FIG. 13 is a flowchart that illustrates the steps of the process performed by the load control function 125a according to the second embodiment. For example, as illustrated in FIG. 13, the load control function 125a calculates the difference ΔT between the temperature T1AH detected via the first temperature sensor 126AH and the temperature T1BH detected via the second temperature sensor 126BH (Step S201).

Here, when the absolute value of ΔT is equal to or less than a predetermined threshold $ΔT_{TH}$ (Step S202, down), the load control function 125a determines that unbalance of loads between free wheeling diodes in switching elements falls within an acceptable range and returns to Step S201 to calculate ΔT again. Conversely, when the absolute value of ΔT is more than $ΔT_{TH}$, the load control function 125a determines that there is unbalance of loads between free wheeling diodes in switching elements and performs the following process.

First, when ΔT is more than $ΔT_{TH}$ (Step S202, left), the load control function 125a determines that the load on the free wheeling diode 21AHd included in the first switching module 21A is high and then determines whether the resistance value of the gate resistance RG1AH of the transistor 21AHt included in the first switching module 21A falls within a predetermined adjustable range (Step S103). Here, for example, the predetermined adjustable range is defined by using the predetermined maximum value $RG_{max}$ and minimum value $RG_{min}$.

Then, the load control function 125a performs the same process as that at Steps S103 to S108 illustrated in FIG. 11 to increase RG1AH by a predetermined value to reach the reference value or decrease RG1BH by a predetermined value to reach the reference value.

Conversely, when ΔT is less than $-ΔT_{TH}$ (Step S202, right), the load control function 125a determines that the load on the free wheeling diode 21BHd included in the second switching module 21B is high and then determines whether the resistance value of the gate resistance RG1BH of the transistor 21BHt included in the second switching module 21B falls within the predetermined adjustable range (Step S109). Here, for example, the predetermined adjustable range is defined by using the predetermined maximum value $RG_{max}$ and minimum value $RG_{min}$.

Then, the load control function 125a performs the same process as that at Steps S109 to S114 illustrated in FIG. 11 to increase RG1BH by a predetermined value to reach the reference value or decrease RG1AH by a predetermined value to reach the reference value.

This allows the level of load on the free wheeling diode 21AHd included in the first switching module 21A to reach the level of load on the free wheeling diode 21BHd included in the second switching module 21B. As a result, there is a reduction in unbalance of loads between the free wheeling diode 21BHd included in the second switching module 21B and the free wheeling diode 21AHd included in the first switching module 21A.

After RG1AH or RG1BH is adjusted as described above, the load control function 125a returns to Step S201 to calculate ΔI again and then repeatedly performs the above-described process.

Conversely, when neither RG1AH nor RG1BH fall within the adjustable range (Step S106, No, Step S112, No), the load control function 125a does not adjust the resistance value of a gate resistance but shuts down the direct-current power supplied to each switching module (Step S115).

Furthermore, the load control function 125a controls the switching elements 21AL and 21BL on the lower side in the first switching module 21A and the second switching module 21B in the same manner as well as the switching elements 21AH and 21BH on the upper side. Specifically, the load control function 25a detects a temperature T1AL of the free wheeling diode 21ALd on the lower side, included in the first switching module 21A, via a third temperature sensor 126AL provided in the first switching module 21A. Then, the load control function 25a adjusts the resistance value of the gate resistance RG1AL of the transistor 21ALt on the lower side, included in the first switching module 21A, in accordance with the detected temperature T1AL. Furthermore, the load control function 25a detects a temperature T1BL of the free wheeling diode 21BLd on the lower side, included in the second switching module 212, via a fourth current sensor 126EL provided in the second switching module 21B. Then, the load control function 25a adjusts the resistance value of the gate resistance RG1BL of the transistor 21BLt on the lower side, included in the second switching module 21B, in accordance with the detected temperature T1BL. Furthermore, the load control function 125a con the switching elements 22AH and 22BH on the upper side and the switching elements 22AL and 22BL on the lower side in the third switching module 22A and the fourth switching module 22B in the same manner.

Here, for example, the above-described processing circuitry 125 is implemented by using a processor. In such a case, for example, the load control function 125a included in the processing circuitry 125 is stored in a predetermined memory in the form of program executable by a computer. The processing circuitry 125 reads a program from the memory and executes it to implement the function that corresponds to the program. In other words, after having read the program, the processing circuitry 125 has the load control function 125a illustrated in the processing circuitry 125 of FIG. 12. In this case, for example, the operations at Steps S251 to S252 and S103 to S115 illustrated in FIG. 13 are performed when for example the processing circuitry 125 reads the program that corresponds to the load control function 125a from the predetermined memory.

Here, in the example illustrated in FIG. 12, the load control function 125a is implemented by using the single processing circuitry 125; however, this is not a limitation on embodiments. For example, the processing circuitry 125 may be configured by combining multiple independent processors so that the load control function 125a implemented when each processor executes a program. Furthermore, the load control function 125a included in the processing circuitry 125 may be implemented by being distributed or combined in one or more processing circuits as appropriate.

As described above, according to the second embodiment, the load control function 125a included in the processing circuitry 125 of the inverter device 120 monitors the temperature of the free wheeling diode included in each switching element and, in accordance with the temperature, controls the load on each free wheeling diode to prevent unbalance of loads between the free wheeling diodes in the switching elements.

That is, according to the second embodiment, when unbalance of loads occurs between free wheeling diodes in switching elements, the unbalance is autonomously controlled due to the load control function 125a included in the processing circuitry 125 so that the inverter device 120 may be kept in a stable direction. As a result, it is possible to prevent damages to free wheeling diodes due to thermal runaway.

Thus, the inverter device 120, the gradient amplifier 3, and the magnetic resonance imaging device 100 according to the second embodiment can operate in a stable manner even in a state of highly loaded operation.

Furthermore, in the explanation of the example according to the above-described embodiment, the load control function controls dV/dt by controlling the gate resistance of the transistor included in each switching element; however, this is not a limitation on embodiments. For example, the load control function may control dV/dt by using a dynamically programmable electronic volume, or the like.

Furthermore, the above-described embodiments may be not only implemented individually but also implemented by being combined as appropriate. That is, the load control function may monitor both the current flowing through the free wheeling diode included in each switching element and the temperature of the free wheeling diode and, in accordance with the current and the temperature, control the load on each free wheeling diode to prevent unbalance of loads between the free wheeling diodes in the switching elements.

Furthermore, in the explanation of the example according to the above-described embodiment, the inverter device disclosed in the subject application is applied to the gradient amplifier of the MRI device; however, this is not a limitation on embodiments. For example, the inverter device disclosed in the subject application is also applicable to other types of devices that require a high-output inverter device.

Furthermore, the term "processor" used in the above explanation of each embodiment means, for example, a CPU (central processing unit), a GPU (graphics processing unit), or a circuit, such as an application specific integrated circuit (ASIC), a programmable logic device (e.g., a simple programmable logic device (SPLD), a complex programmable logic device (CPLD), or a field programmable gate array (FPGA)). Here, instead of storing programs in the memory, a configuration may be such that programs are directly installed in a circuit of a processor. In this case, the processor reads a program installed in the circuit and executes it, thereby implementing a function. Furthermore, with regard to each processor according to the present embodiment, each processor is not always configured as a single circuit but also configured as a single processor by combining multiple independent circuits so that its function is implemented.

Here, a program executed by a processor is provided by being previously installed in a ROM (read only memory), a memory, or the like. The program may be provided by being recorded in the form of file installable or executable by the device in a storage medium readable by a computer, such as CD (compact disk)-ROM, FD (flexible disk), CD-R (recordable), or DVD (digital versatile disk). Furthermore, the program may be stored in a computer connected to a network such as the Internet and provided or distributed by being downloaded via the network. For example, the program is configured by using a module including the above-described functional units. In the actual hardware, the CPU reads the program from a storage medium such as ROM and executes it so that each module is located into the primary storage device and is generated in the primary storage device.

According to at least one of the embodiments described above, it is possible to provide an inverter device, a gradient amplifier, and a magnetic resonance imaging device that can operate in a stable manner even in a state of highly loaded operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An inverter device comprising:
    a plurality of switching elements that are connected to each other in parallel and each include a transistor and a free wheeling diode connected to the transistor in antiparallel; and
    processing circuitry configured to:
        monitor a current or a temperature of the free wheeling diode included in each switching element, to determine whether an unbalance of loads between each free wheeling diode has occurred by comparing the current or the temperature of each wheeling diode, and
        when determining that the unbalance has occurred, control a load on each free wheeling diode so that the unbalance is reduced.

2. The inverter device according to claim 1, wherein the processing circuitry controls a gate resistance of the transistor included in each switching element, thereby controlling the load on each free wheeling diode.

3. The inverter device according to claim 1, wherein the processing circuitry manages a characteristic of the free wheeling diode included in each switching element to prevent an unbalanced loss of each free wheeling diode.

4. The inverter device according to claim 3, wherein the processing circuitry controls dV/dt during a switching operation of the transistor included in each switching element, thereby indirectly controlling a loss of the free wheeling diode.

5. The inverter device according to claim 4, wherein the processing circuitry controls a gate resistance of the transistor included in each switching element, thereby controlling the dV/dt.

6. The inverter device according to claim 1, wherein the switching elements are configured by combining free wheeling diodes with an identical characteristic.

7. The inverter device according to claim 1, wherein the processing circuitry monitors a reverse recovery current or a forward current of the free wheeling diode as the current flowing through the free wheeling diode.

8. The inverter device according to claim 1, wherein the processing circuitry monitors a junction temperature or a case temperature of the switching element as a temperature of the free wheeling diode.

9. A gradient amplifier comprising an inverter device that outputs a voltage corresponding to a waveform of a gradient magnetic field to a gradient coil used in a magnetic resonance imaging device, wherein
    the inverter device includes
        a plurality of switching elements that are connected to each other in parallel and each include a transistor and a free wheeling diode connected to the transistor in antiparallel; and
        processing circuitry configured to:
            monitor a current or a temperature of the free wheeling diode included in each switching element, to determine whether an unbalance of loads between each free wheeling diode has occurred by comparing the current or the temperature of each wheeling diode, and
            when determining that the unbalance has occurred, control a load on each free wheeling diode so that the unbalance is reduced.

10. A magnetic resonance imaging device comprising:
    a gradient coil that applies a gradient magnetic field to an imaging space where a subject is located; and
    a gradient amplifier including an inverter device that outputs a voltage corresponding to a waveform of the gradient magnetic field to the gradient coil, wherein
    the inverter device includes
        a plurality of switching elements that are connected to each other in parallel and each include a transistor and a free wheeling diode connected to the transistor in antiparallel; and
        processing circuitry configured to:
            monitor a current or a temperature of the free wheeling diode included in each switching element, to determine whether unbalance of loads between each free wheeling diode has occurred by comparing the current or the temperature of each wheeling diode, and
            when determining that the unbalance has occurred, control a load on each free wheeling diode so that the unbalance is reduced.

* * * * *